(12) United States Patent
Gosmain et al.

(10) Patent No.: US 7,304,878 B2
(45) Date of Patent: Dec. 4, 2007

(54) AUTONOMOUS ANTIFUSE CELL

(75) Inventors: Vincent Gosmain, Aix-en-Provence (FR); Florent Garcia, Fuveau (FR)

(73) Assignee: Atmel Corporation, San Jose, CA (US)

( * ) Notice: Subject to any disclaimer, the term of this patent is extended or adjusted under 35 U.S.C. 154(b) by 84 days.

(21) Appl. No.: 11/375,839

(22) Filed: Mar. 14, 2006

(65) Prior Publication Data

US 2007/0127283 A1   Jun. 7, 2007

(30) Foreign Application Priority Data

Dec. 7, 2005 (FR) .................................. 05 12419

(51) Int. Cl.
*G11C 17/00* (2006.01)
(52) U.S. Cl. ................ 365/96; 365/225.7; 365/189.11; 365/205
(58) Field of Classification Search ........... 365/96, 365/225.7, 189.05, 189.11, 205, 196; 327/525
See application file for complete search history.

(56) References Cited

U.S. PATENT DOCUMENTS

| | | | |
|---|---|---|---|
| 5,418,487 A | 5/1995 | Armstrong, II | 327/525 |
| 5,452,355 A | 9/1995 | Coli | 380/4 |
| 5,731,733 A | 3/1998 | Denham | 327/525 |
| 5,789,970 A | 8/1998 | Denham | 327/525 |
| 6,011,742 A * | 1/2000 | Zheng | 365/225.7 |
| 6,108,260 A * | 8/2000 | Casper | 365/225.7 |
| 6,426,668 B1 | 7/2002 | Morrish et al. | 327/525 |
| 6,618,311 B1 | 9/2003 | Becker | 365/225.7 |
| 6,628,561 B2 * | 9/2003 | Van De Graaff | 365/225.7 |
| 7,236,043 B2 * | 6/2007 | Wich et al. | 327/525 |
| 2003/0234665 A1 | 12/2003 | Smith et al. | 326/37 |

* cited by examiner

*Primary Examiner*—Richard T. Elms
*Assistant Examiner*—Toan Le
(74) *Attorney, Agent, or Firm*—Schneck & Schneck; Thomas Schneck

(57) ABSTRACT

An autonomous antifuse cell providing protection against intruders includes an antifuse, sense circuitry, feedback circuitry, program circuitry, and blocking circuitry. The blocking circuitry blocks access of any programming voltage input signals to the antifuse device if the antifuse is previously blown and when power is applied to the cell. In an exemplary embodiment, the antifuse cell uses only a single external access pin. Once the antifuse device is blown and during subsequent power-up operations, intrusion is prevented.

14 Claims, 1 Drawing Sheet

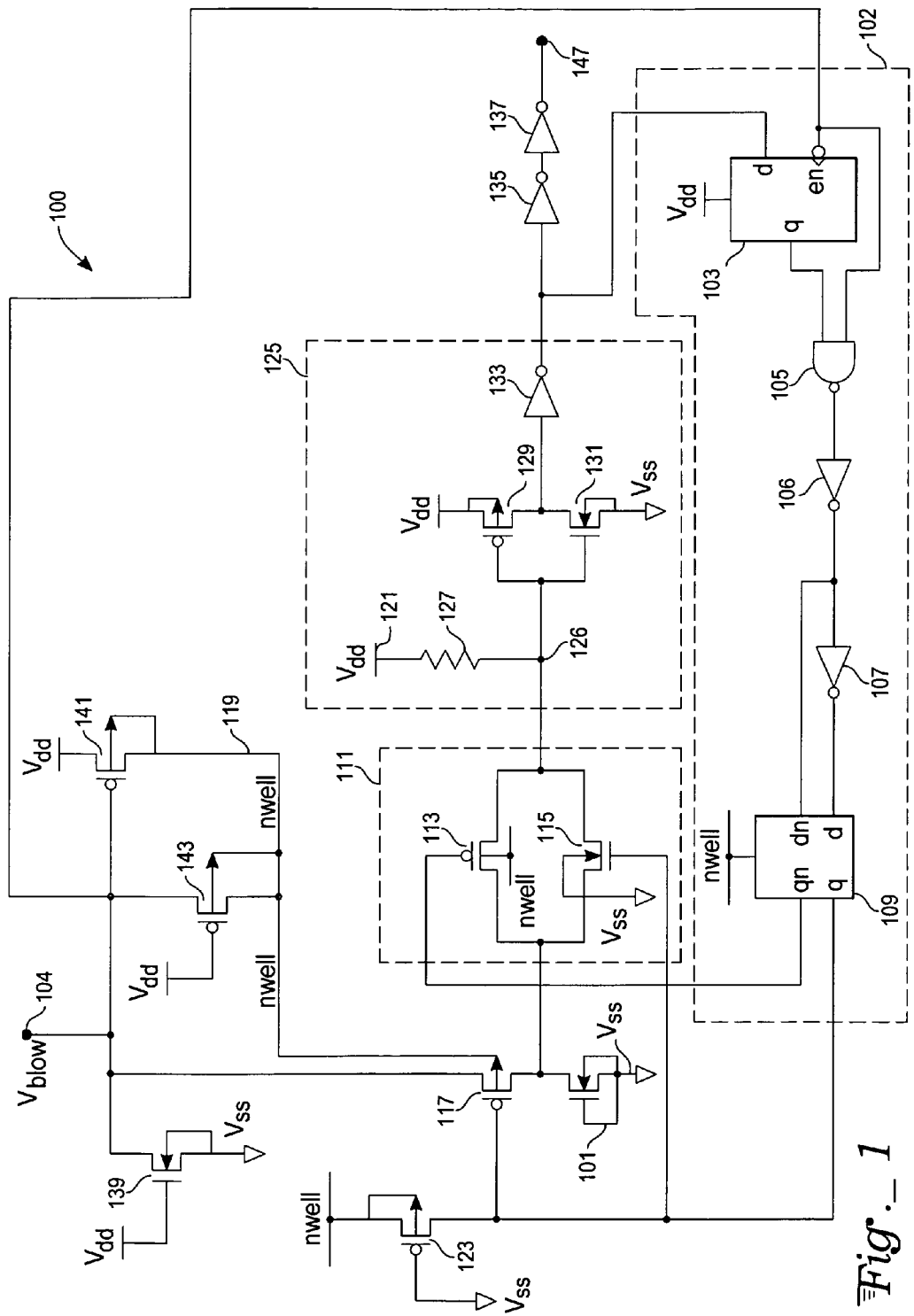
Fig._1

US 7,304,878 B2

AUTONOMOUS ANTIFUSE CELL

TECHNICAL FIELD

The present invention relates to antifuse devices, and, more particularly to techniques for protecting such devices from intrusion.

BACKGROUND ART

Antifuses are devices that are used in integrated circuits (IC's) to provide various circuit selection and configuration functions. When fabricated as part of IC memory devices, antifuses are used, for example, to control access to pre-programmed applications and stored data.

An antifuse device is said to be programmed, or "blown," when the antifuse device is altered from a high resistance state to a low resistance state. This is typically accomplished by applying a higher than normal voltage or a laser beam to the antifuse device. The higher voltage, for example, produces a low resistance antifuse circuit where a high resistance un-programmed antifuse circuit previously existed. A laser beam creates a similar low resistance circuit condition in the antifuse device. In digital circuit applications, a blown antifuse device changes a high impedance path to a current conducting path that effects a change in a logic level with an applied current. An antifuse structure generally comprises two conductors, either metal and/or a semiconductor material, that have some type of dielectric or insulating material between the two conductors. Previously, the dielectric or insulating material was in the form of a thin layer of high resistance amorphous silicon to which a programming voltage was applied to change the amorphous silicon into a thin layer of lower resistance polysilicon. Recently, the dielectric or insulating material is provided, for example, as a thinner-than-normal gate dielectric layer of an FET. In the presence of high voltage or laser power the thin oxide is electrically broken down and the antifuse device is programmed, or is said to blow. Typically, the change in conduction of an antifuse device is effected without substantially affecting any remaining components of a circuit.

In memory devices, antifuses are used, for example, in programmable read-only memory circuits. A device manufacturer may, for example, program proprietary information into a memory device and then blow one or more antifuses to deny access to the proprietary information. Antifuse cells are often used to disable particular functions in an IC after testing or to disable access to specific memory locations within a memory circuit.

Antifuse cells or circuits often receive multiple control signals, for example, a select signal(SEL), an enable signal (EN), a program voltage control signal ($V_{blow}$), etc. The corresponding terminals for each of these control signals create possible access points to the antifuse cell for an unauthorized user or for an intruder.

An input terminal for a programming voltage, or a $V_{blow}$ signal terminal, for example, is particularly vulnerable to unauthorized access or intrusion. This is because, if a sufficiently high voltage is applied to the $V_{blow}$ terminal, the input characteristics of an antifuse sense circuit may be altered such that an output signal of the protected circuit erroneously indicates that the antifuse is intact, or not programmed. A current method of preventing access to the $V_{blow}$ input terminal is to route the $V_{blow}$ signal to a core of an IC die from a pin or terminal that is not located on the IC die itself but is on the IC wafer for that IC die. According to this method, a die is tested before the die is parted from the IC wafer and the antifuse cell is appropriately programmed. After partition of the die from the wafer, the antifuse cell itself cannot be accessed. A drawback of this method of preventing access to the $V_{blow}$ input terminal is that a die purchaser is prevented from programming the antifuse after the die is cut from the wafer.

What is needed is an antifuse cell that requires a minimum of control signals and that also allows a user to program an antifuse cell after the die has been cut from a wafer, while still providing a high level of protection against unauthorized access to the antifuse cell.

SUMMARY

The present invention provides an antifuse cell that allows a user to program the antifuse cell, that does not need several control signals for programming, and that provides a high degree of protection against outside access.

The present invention is for an autonomous antifuse cell. The antifuse cell includes an antifuse device that has a first terminal connected to a ground voltage and that has a second sensed terminal. The antifuse device has a higher resistance unprogrammed intact state and a lower resistance programmed state. A programming voltage input terminal receiving a programming voltage and a PMOS pass transistor connects the programming voltage to the second sensed terminal of the antifuse device. The PMOS pass transistor has a control gate terminal. A transmission gate has an input terminal connected to the second sensed terminal of the antifuse device and has an output terminal. The transmission gate has one or more control signal input terminals for controlling conduction of the transmission gate.

A sense circuit has an input terminal connected to the output terminal of the transmission gate and has an output terminal (connected to an antifuse cell output terminal.

A level shifter has one or more output terminals connected to a control gate terminals of the PMOS pass transistor and to one or more control signal input terminals of the transmission gate. The level shifter provides a write mode for conduction of the PMOS pass transistor to program the antifuse device or for conduction of the transmission gate. The level shifter alternatively provides a read mode for conduction of the transmission gate. The level shifter has a control input terminal for receiving a control signal.

A feedback latch logic circuit has a first input terminal connected to the output terminal of the sense circuit and has a second input terminal connected to the programming voltage input terminal. The feedback latch logic circuit has an output terminal that is coupled to the control input terminal of the level shifter. The output signal of the latch logic circuit has a first output state for controlling the level shifter to be in the write mode for conduction of the PMOS pass transistor to program the antifuse device. The feedback latch logic circuit has a second output state for controlling the level shifter to be in the read mode for conduction of the transmission gate.

The feedback latch logic circuit further includes: an asynchronous d flip-flop circuit wherein the first input terminal is for a d input signal and the second input terminal is for an enable signal; and a NAND gate having one input terminal connected to a d output terminal of the asynchronous flip-flop circuit. The NAND gate has a second input terminal connected to the programming input terminal. The NAND gate has an output terminal coupled to a control input terminal of the level shifter.

The antifuse cell further includes a PMOS nwell level control transistor having a channel connected between a VDD voltage terminal and a nwell voltage bus. The PMOS nwell level control transistor has a gate terminal connected to the program pin, such that: when no programming voltage is present at the programming voltage input terminal, the PMOS nwell level control transistor conducts to provide the VDD voltage to the nwell voltage bus; and such that when the programming voltage is present at the programming voltage input terminal, the PMOS nwell level control transistor does not conduct.

The nwell voltage bus is connected to a voltage supply terminal of the level shifter.

The antifuse cell further comprises a PMOS nwell boost transistor having a channel connected between the programming voltage input terminal and the nwell voltage bus. The PMOS nwell boost transistor has a gate terminal connected to a Vdd voltage bus, such that: when the programming voltage is present at the programming voltage input terminal, the PMOS nwell boost transistor conducts to connect the programming voltage to the nwell voltage bus; and such that when the programming voltage is not present at the programming voltage input terminal, the PMOS nwell boost transistor does not conduct.

The antifuse cell further comprises a PMOS gate discharge transistor having a channel connects between the nwell voltage bus and the output terminal of the level shifter and the gate terminal of the PMOS pass transistor.

The antifuse cell further comprises a NMOS drain transistor that has a channel connected between the program pin and a Vss ground voltage terminal and that has a gate terminal connected to a Vdd voltage terminal.

The antifuse cell further has the input terminal of the sense circuit connected to one end of a pull-up resistor and the other end of the pull-up resistor is connected to a Vdd voltage terminal.

The present invention provides a method of protecting an antifuse cell from intrusion. The method includes the step of providing an antifuse device having a first terminal connected to a ground voltage and having a second sensed terminal, where the antifuse device having a higher resistance unprogrammed intact state and a lower resistance programmed state.

The method includes the step of providing a programming voltage input terminal for receiving a programming voltage.

The method includes selectively connecting a PMOS pass transistor between the programming voltage and the second sensed terminal of the antifuse device to thereby program the antifuse device with the programming voltage.

The method includes selectively connecting the second sensed terminal of the antifuse device to an input terminal of a sense circuit.

The method includes sensing the state of the antifuse with a sense circuit having an input terminal connected to the output terminal of the transmission gate and having an output terminal connected to an antifuse cell output terminal.

The method includes providing alternative control signals for placing the antifuse cell in either a programming state or a read state by using a level shifter that has an output terminal connected to the control gate terminal of the PMOS pass transistor and one or more output terminals connected to one or more control signal input terminals of the transmission gate. The level shifter provides in a write mode for conduction of the PMOS pass transistor to program the antifuse device or for conduction of the transmission gate. The level shifter alternatively provides in a read mode conduction of the transmission gate. The level shifter has a control input terminal for receiving a control signal.

The method includes controlling the level shifter using a feedback latch logic circuit having a first input terminal connected to the output terminal of the sense circuit and having a second input terminal connected to the programming voltage input terminal. The feedback latch logic circuit has an output terminal that is coupled to the control input terminal of the level shifter. The output signal of the latch logic circuit has a first output state for controlling the level shifter to be in the write mode for conduction of the PMOS pass transistor to program the antifuse device. The feedback latch logic circuit has a second output state for controlling the level shifter to be in the read mode for conduction of the transmission gate.

The method further comprises the step of: connecting a channel of a PMOS nwell level control transistor a VDD voltage terminal and a nwell voltage bus and controlling the PMOS nwell level control transistor using a gate terminal connected to the program pin such that: when no programming voltage is present at the programming voltage input terminal, the PMOS nwell level control transistor is conducting to provide the VDD voltage to the nwell voltage bus; and such that when the programming voltage is present at the programming voltage input terminal, the PMOS nwell level control transistor is not conducting.

The method further comprises the step of boosting the voltage on the nwell voltage bus with a PMOS nwell boost transistor having a channel connected between the programming voltage input terminal, such that: when the programming voltage is present at the programming voltage input terminal, the PMOS nwell boost transistor conducts to connect the programming voltage to the nwell voltage bus; and when the programming voltage is not present at the programming voltage input terminal, the PMOS nwell boost transistor does not conduct.

The method further comprises the step of discharging the gate terminal of the PMOS pass transistor using a PMOS gate discharge transistor having a channel connects between the nwell voltage bus and the output terminal of the level shifter.

The method includes the step of sensing the state of the antifuse with a sense circuit and includes connecting one end of a pull-up resistor to a VDD voltage terminal and the other end of the pull-up resistor to the input terminal of the sense circuit.

BRIEF DESCRIPTION OF THE DRAWINGS

FIG. 1 is a schematic circuit diagram of an exemplary embodiment of the present invention.

DETAILED DESCRIPTION

In the following description, numerous specific details are set forth such as device types and configurations to provide a thorough understanding of the present invention. However, it will be obvious to those skilled in the art that the present invention may be practiced without such specific details. In other instances, well-known circuits are shown in block diagram form in order not to obscure the present invention in unnecessary detail. Details concerning circuit construction and the like have been omitted in so much as the omitted details are not necessary to obtain a complete understanding of the present invention and are within the skills of a person of ordinary skill in the relevant art.

The circuitry of the antifuse cell 100 is first described. Programming of the antifuse cell 100 is next described. Then, operation of the antifuse cell 100 in a programmed state is described.

Antifuse Cell Circuitry

Referring to FIG. 1, an autonomous antifuse cell 100 includes an initially unprogrammed, or high resistance, antifuse device 101. This antifuse cell is autonomous in the sense that it is not to be controlled or influenced by would-be intruders. The antifuse device 101 is configured in this specific exemplary embodiment as a thin-gate NMOS FET device with one terminal having its gate, well, and drain terminals all connected together to a Vss ground voltage terminal. The source terminal of the NMOS FET antifuse device 101 is the other terminal of the antifuse device 101 and is called the sensed terminal because the state of the antifuse device 101 is determined by a sense circuit that monitors the sensed terminal. One skilled in the art will recognize that alternatives are available for constructing the antifuse element, such as, for example, an amorphous silicon layer, a layer of ferroelectric material, or a layer of oxide-nitride-oxide dielectric material that breakdowns when a suitable program voltage is applied.

In a specific exemplary embodiment, an antifuse cell 100 according to the present invention has two states. One state is an un-programmed state, in which an un-programmed antifuse device 101 is intact to provide a relatively higher resistance. The other state is a programmed state, in which the antifuse is programmed, or altered, to provide relatively lower resistance.

The antifuse cell 100 is provided with a feedback circuit 102. As described herein below, the feedback circuit 102 is used to establish various circuit conditions during a power-up operation, that is, upon an initial application of Vdd electrical power to the antifuse cell 100. The feedback circuit 102 in conjunction with other circuit elements provides for initial programming of an antifuse element 101 using a programming voltage Vblow provided at a program voltage terminal 104. Typically, the programming voltage Vblow is 12 volts. Of course, other voltage levels are used, as required. A Vdd voltage of 1.8 volts is used with corresponding logic HIGH and LOW voltage levels. Note that a PMOS transistor is turned on when its gate terminal is presented with a LOW voltage level and that a PMOS transistor is turned off when its gate terminal is presented with a HIGH voltage level. Similarly, a NMOS transistor is turned on when its gate terminal is presented with a HIGH voltage level and that a NMOS transistor is turned off when its gate terminal is presented with a LOW voltage level. After the antifuse device 101 is programmed to a relatively low resistance, the feedback circuit provides for isolation of the program voltage terminal 104 from the antifuse element 101. A sense circuit is provided for sensing the state of the antifuse element 101.

The feedback circuit 102 includes a feedback latch circuit 103, a 2-input NAND gate 105, a pair of inverters 106, 107, and a level shifter 109.

The feedback latch circuit 103 is an asynchronous D flip-flop that has a d input terminal and also has an inverted enable (en) input terminal that is connected to a Vblow terminal 104 that receives a $V_{blow}$ programming signal. A q output terminal of the feedback latch circuit 103 is connected to one input terminal of a 2-input NAND gate 105. The enable input terminal en of the feedback latch circuit 103 is also connected to another input terminal of the 2-input NAND gate 105. An output terminal of the 2-input NAND gate 105 is connected to an input terminal of the inverter 106. An output terminal of the inverter 106 is connected to a dn input terminal of the level shifter 109 and is also connected to an input terminal of the inverter 107. An output terminal of the inverter is connected to a d input terminal of the level shifter 109.

A transmission gate 111 is formed with a PMOS pass gate transistor 113 and an NMOS pass gate transistor 115. The source terminals of the pass gate transistors 113, 115 are connected together and to the sensed, or source, terminal of the FET antifuse device 101. The drain terminals of the PMOS pass gate transistor 113 and the NMOS pass gate transistor terminals are connected together and to a sense input node 126 of the sense circuit 125. A substrate for the PMOS pass gate transistor 113 is connected to a nwell voltage node and a substrate for the NMOS pass gate transistor 115 is connected to a Vss ground voltage node.

A qn output terminal of the level shifter 109 is connected to a gate terminal of the PMOS pass gate transistor 113. A q output terminal of the level shifter 109 is connected to a gate terminal of the NMOS pass gate transistor 115.

The sense circuit 125 includes a pull-up resistor 127 that has one end connected to the sense input node 126 and the other end connected to a node for a Vdd positive voltage that is typically 1.8 volts. A PMOS transistor 129 and a NMOS transistor 131 have their respective gate terminals and their respective source terminals connected together to form a sense inverter. The drain terminal of the PMOS transistor 129 is connected to the Vdd positive voltage node. The drain terminal of the NMOS transistor 131 is connected to the Vss ground voltage node. The source terminals of the transistors 129, 131 are connected to an input terminal of a sense circuit output inverter 133. An output terminal of the sense circuit output inverter 133 is connected to the d input terminal of the feedback latch circuit. The output terminal of the sense circuit output inverter 133 is connected to an input terminal of an inverter 135. An output terminal of the inverter 135 is connected to an input terminal of an inverter 137. An output terminal of the inverter 137 is connected to an antifuse cell output terminal 147.

A PMOS pass transistor 117 has its source terminal connected to the source terminal of the antifuse device 101. A gate terminal of the PMOS pass transistor 117 is connected to the q output terminal of the level shifter 109. A source terminal of the PMOS pass transistor 117 is connected to a program voltage terminal 104 at which is provided a $V_{blow}$ voltage, for example, 12 volts. The gate terminal of the PMOS pass transistor 117 is also connected to a drain terminal of a PMOS gate discharge transistor 123 that has its gate terminal connected to a Vss ground voltage. A source terminal of the PMOS gate discharge transistor 123 is connected to a nwell voltage 119. The drain terminal of the PMOS pass transistor 117 and the program pin 104 are also connected to a drain terminal of a NMOS drain transistor 139. The gate terminal of the NMOS drain transistor 139 is connected to the $V_{dd}$ positive voltage and the drain terminal of the NMOS drain transistor 139 is connected to the $V_{ss}$ ground voltage.

A PMOS nwell level control transistor 141 has its source terminal connected to the $V_{dd}$ positive voltage. A gate terminal of the PMOS nwell level control transistor 141 is connected to the program pin 104. A drain terminal of the PMOS nwell level control transistor 141 is connected to an nwell voltage bus 119. The nwell voltage is provided to other locations in the antifuse cell 100, as described herein below. A drain terminal of a PMOS nwell boost transistor 143 is connected to the program pin 104. A source terminal of the PMOS nwell boost transistor 143 is connected to the nwell bus 119 and to the substrate of the PMOS pass transistor 117.

Operation of the Program Voltage Circuitry

With the programming voltage $V_{blow}$ unasserted, or set to a low voltage on program pin 104, the NMOS drain transistor 139 pulls down the gate terminal of the nwell level control transistor 141 to turn on the nwell level control transistor 141 and set the voltage level on nwell 119 to be substantially the $V_{dd}$ positive voltage. In this case, the PMOS nwell boost transistor 143 is off. The PMOS gate discharge transistor 123 is turned on to provide the nwell voltage 119 to the gate terminal of the PMOS pass transistor 117. The PMOS pass transistor 117 is in an off state and does not conduct current from the program pin 104 to the antifuse device 101.

In one specific exemplary embodiment, the $V_{blow}$ voltage is 12 volts. When this $V_{blow}$ voltage is provided at the program pin 104 and at the gate terminal of the nwell level control transistor 141, the nwell level control transistor 141 is turned off and the PMOS nwell boost transistor 143 is turned on, which applies the $V_{blow}$ voltage to the nwell voltage bus 119. The program voltage drain transistor 139 is not strong enough to affect the $V_{blow}$ voltage and is used to remove charge from the gate of the nwell level control transistor 141 by connecting the gate terminal to ground.

The $V_{blow}$ voltage is also applied to the other input terminal of the 2-input NAND 105, which, with the logic '1' from latch 103, results in the NAND gate 105 having a LOW output, which causes the level shifter 109 to provide a LOW signal at its q output terminal. A LOW output signal at the q output terminal of the level shifter 109 places the antifuse cell 100 in a program mode, while a HIGH signal at the q output terminal places the antifuse cell in a read configuration.

Note that the supply voltage for the level shifter 109 and the substrate of the PMOS pass gate transistor 113 are both provided by the nwell voltage bus 119. The 12 volt $V_{blow}$ voltage is applied to both the gate of the PMOS pass gate transistor 113 by the inverting output of level shifter 109 and to the well of the PMOS pass gate transistor 113 via the body connection to the nwell voltage bus 119, which increases the isolation between the $V_{blow}$ programming voltage and the sense circuit 125.

A LOW level at the q output terminal of the level shifter 109 turns off the NMOS pass gate transistor 115, while a HIGH level at the qn output terminal of the level shifter 109 turns off the PMOS pass gate transistor 113. This closes the transmission gate 111 to isolate the sense node 126 from the high voltage at program pin 145. The voltage at sense node 126 rises toward the Vdd level which provides a HIGH voltage signal at the output terminal of the sense inverter. This high voltage is conveyed to the antifuse cell output terminal 147 via the output buffers 135, 137. This HIGH voltage signal is also provided to the d input terminal of the feedback latch 103. A HIGH signal at the antifuse cell output terminal 147 indicates an intact, or unprogrammed, antifuse device 101.

The q output terminal of the level shifter 109 is also applied to the base of the PMOS pass transistor 117, which now conducts to supply a substantially undiminished $V_{blow}$ voltage from program pin 104, through the PMOS pass transistor 117 to the antifuse device 101. Application of the $V_{blow}$ voltage damages the FET antifuse device 101, causing a permanent decrease in resistance. In a specific exemplary embodiment, the resistance of an intact antifuse is several Megohms, while a so called blown, or programmed, antifuse device has a much lower resistance, for example, between 10 ohms and 14 kohms.

When the $V_{blow}$ programming voltage is removed from the program pin 104, the NMOS drain transistor 139 drains the charge on the base of the nwell level control transistor 141. This eventually turns on the nwell level control transistor 141, causing the voltage on the nwell voltage bus 119 to decrease to the Vdd voltage level. The $V_{blow}$ programming voltage is also removed from the other input terminal of the NAND gate 105, causing the level shifter 109 to switch to the read configuration. The level shifter 109 is then supplied by the nwell voltage bus 119, so a high output voltage drops to Vdd, the transmission gate 111 is returned to a conducting state, and the PMOS pass transistor 117 is turned off.

Operation in a Programmed State

When the antifuse device 101 is in a low resistance programmed state and the transmission gate 111 is functioning, the sense circuit 125 detects a low voltage at the sense node 126 which causes a LOW signal level at the output of the sense circuit 125 and at the antifuse cell output terminal 147.

A high voltage applied to the program pin 104 with the antifuse device 101 being sensed to be in a blown condition will not affect the output signal of the sense circuit 125 or the output level of the antifuse cell 100 at terminal 147.

The logic LOW output signal of latch 103 prevents the NAND 105 from switching states and the level shifter 109 remains in the read configuration. The high voltage at the program pin 104 is blocked by the PMOS pass transistor 117, which is biased into cutoff by a voltage equal to that applied to the program pin 104 via the nwell voltage bus 119.

If the programmed antifuse cell 100 is initially powered-up, or energized, with a blown, or programmed, antifuse device 101 when a high voltage level is also applied to the program pin 104, that high programming voltage level is also present at an input terminal of the feedback latch 103. This produces a logic LOW at the one input terminal of the NAND gate 105 and results in a logic HIGH at the output terminal of the NAND gate 105. The level shifter 109 remains in the read configuration with the q output terminal HIGH so that the high voltage from the program pin 104 is blocked by the PMOS pass transistor 117, which is biased into cutoff by a voltage equal to that applied to the program pin 104 via the nwell voltage bus 119. The transmission gate 111 is still biased for conduction and the voltage at sense node 126 remains low. This results in a LOW output at the antifuse cell output terminal 147, indicating a blown, or programmed, antifuse device 101.

Note that, as described below, the output signal of the level shifter 109 at terminal qn determine whether or not a program voltage is applied to the antifuse device 101. The output signals qn and q of the level shifter 109 operate a transmission gate 111 that provides a signal from the antifuse device 101 to a sense circuit 125 that determines whether the antifuse device 101 is programmed or not.

When a logic HIGH is provided on the q non-inverting output terminal of the level shifter 109, the level shifter 109 is said to be in a read configuration. In contrast, when a logic LOW is provided on the q non-inverting output terminal, the level shifter 109 is said to be in a program configuration.

The same logic HIGH signal applied to NMOS pass gate transistor 115 is applied to the PMOS pass transistor 117, biasing it into cutoff. When the 12 volt $V_{blow}$ is not asserted, the nwell voltage bus 119 is at the same potential as the Vdd supply voltage. In a specific exemplary embodiment, Vdd is 1.8 volts.

Even though the gate of the PMOS gate discharge transistor 123 base is biased for conduction of the PMOS gate discharge transistor 123, no current will flow as level shifter 109 is supplied by nwell 119, leaving source and drain of the PMOS gate discharge transistor 123 at substantially the same voltage.

When the antifuse device 101 is intact, or not programmed, the relatively high resistance of the antifuse device 101 results in a high voltage at sense node 126, which results in a logic HIGH at the output of the sense circuit output inverter 133, which is transmitted via output inverting buffers 135, 137, to an output pin 147 of the antifuse cell, indicating that the antifuse 101 is intact. The same logic HIGH is transmitted to the non-inverted input terminal of the feedback latch circuit 103.

In summary, an initial mode of operation of the antifuse cell 100 is one in which an antifuse device 101 is still intact, or unprogrammed, with a relatively high resistance. $V_{dd}$ power is then turned on. The feedback latch circuit 103 has its q output level set to a logic LOW during any power-up of the antifuse cell 100. The level shifter 109 q output level is set to a logic HIGH during a power-up of the antifuse cell 100. The NMOS drain transistor 139 pull the PMOS pass transistor 117 down to a logic LOW state. The PMOS well level control transistor 141 is turned on to connect the nwell voltage bus 119 to the Vdd voltage, while the PMOS nwell boost transistor 143 is turned off. Because the q terminal of the level shifter 109 is set to a HIGH level and the qn terminal of the level shifter is set to a LOW level, the PMOS pass transistor 117 is turned off. The PMOS pass gate transistor 113 and the NMOS pass gate transistor 115 are also turned on so that the transmission gate 111 conducts. Since the antifuse device 101 is unprogrammed, or intact, the voltage on the sense node 126 of the sense circuit 125 is HIGH. This results in a High level at the output of the sense circuit output buffer 133 and at the antifuse cell output terminal 147. In this case the voltage level at the q terminal of the feedback latch circuit 103 rises to a HIGH level which does not affect the NAND gate 105 output and which maintains a HIGH level at the d input terminal of the level shifter 109 so that the q terminal of the level shifter 109 is at a HIGH level. In this manner, the transmission gate 111 is turned on to maintain the antifuse cell in a read configuration.

The next mode of operation for the antifuse cell 100 is when the antifuse device 101 is to be programmed, or "blown." The Vblow programming voltage at the antifuse program pin or terminal 104 is raised to 12 volts. In that case, the PMOS nwell level control transistor 141 is turned off. The PMOS nwell boost transistor 143 is turned on which shorts the nwell voltage bus 199 to the 12 volts at the program pin 104. At the same time, the 12 volts on pin 104 causes the output of the NAND gate 105 and the d input terminal of the level shifter 109 to fall to a logic LOW state. This causes the q output terminal of the level shifter 109 to go to a logic LOW level and also causes the qn terminal of the level shifter 109 to go to a logic HIGH level, which turns off the transmission gate 111. The 12 volts at pin 104 and the drain terminal of the PMOS pass transistor 117 turns on the PMOS pass transistor 104 to apply the 12 volts across the antifuse device 101, which programs the antifuse device 101 to be in a programmed lower resistance state.

When the 12 volt programming voltage is removed from pin 104, the NMOS drain transistor 139 pulls terminal 104 to the Vss ground voltage. The voltage on the nwell voltage bus 119 falls to the Vdd level of 1.8 volts. The output levels of the NAND gate 105 and the input level to the d input terminal of the level shifter 109 rise to a HIGH level which causes the voltage level at the q output terminal of the level shifter 109 to be HIGH and which causes the voltage level at the qn output terminal of the level shifter 109 to be LOW. These voltage levels turn on the transmission gate 111 to connect the drain terminal of the antifuse device 101 to the sense node 126 of the sense circuit 126. The voltage at the sense node 126 depends on the ratio of the resistance of the antifuse device 101 to the pull-up resistor 127. The input switching level of the sense inverter formed by the PMOS transistor 129 and the NMOS transistor 131 is designed to be higher than the voltage at the sense node 126 when the antifuse device 101 is programmed, or blown. This provides a logic LOW signal at the output terminal of sense circuit output inverter 133 for the sense circuit 125. In this manner, the NAND gate 105 output voltage and the input signal to the d input terminal of the level shifter 109 are both held, more or less, permanently in a logic HIGH state for a programmed antifuse device 101.

With regard to security for the antifuse cell 100, the circuit configuration of the antifuse cell 100, as described herein above, only permits access to the antifuse cell through the program pin 104. Absent the isolation of the antifuse device 101 provided according to the present invention, it is possible that the actual programmed state of other already programmed antifuse devices might be masked or obscured by an intruder applying a voltage greater than 12 volts on the program pin 104. The voltage greater than 12 volts could cause those other already programmed antifuse cells to detect the state of their antifuse as still being intact, or unprogrammed. The present invention prevents such intrusion.

The present invention provides that the antifuse cell 100 is powered up to initially start with the transmission gate 111 turned on. When the antifuse device 101 is programmed, the output level of the sense circuit 125 is held to a LOW state and the q output level of the level shifter 109 is held to a HIGH state. Increasing the programming voltage level at the program pin 104 causes the voltage on the nwell voltage bus to follow that programming voltage level. Also the voltage at the q output terminal is supplied by the nwell voltage so that q output level of the level shifter 109 follows the nwell voltage. This keep the PMOS pass transistor turned off and the transmission gate 111 turned on. After the antifuse device 101 is originally programmed, this arrangement isolates the voltage at the sense node 126 from any voltages on the program pin 104. Also, if a very high voltage level is set at the program pin 104 before the antifuse cell 100 is powered up, the antifuse cell 100 behaves in the same manner to similarly isolate the antifuse cell. The present invention provides for selectively connecting the PMOS pass transistor 117 between the programming voltage and the antifuse device to thereby program the antifuse device 101. The present invention also provides for selectively connecting the antifuse device 101 to an input terminal of the sense circuit using the transmission gate 111.

In the foregoing detailed description of the preferred embodiment, reference is made to the accompanying drawing which form a part hereof, and in which is shown by way of illustration a specific embodiment by which the invention may be practiced. This embodiment is described in sufficient detail to enable those skilled in the art to practice the invention, and it is to be understood that other embodiments may be utilized and that changes may be made without departing from the scope of the present invention.

What is claimed is:

1. An autonomous antifuse cell, comprising:
an antifuse device having a first terminal connected to a ground voltage and having a second sensed terminal, said antifuse device having a higher resistance unprogrammed intact state and a lower resistance programmed state;
a programming voltage input terminal for receiving a programming voltage;
a PMOS pass transistor for connecting the programming voltage to the second sensed terminal of the antifuse device, said PMOS pass transistor having a control gate terminal;
a transmission gate having an input terminal connected to the second sensed terminal of the antifuse device and having an output terminal, said transmission gate having one or more control signal input terminals for controlling the conduction of said transmission gate;
a sense circuit having an input terminal connected to the output terminal of the transmission gate and having an output terminal connected to an antifuse cell output terminal;
a level shifter having an output terminals connected to the control gate terminal of the PMOS pass transistor and to one or more control signal input terminals of the transmission gate, said level shifter providing in a write mode for conduction of the PMOS pass transistor to program the antifuse device or for conduction of the transmission gate, or said level shifter alternatively providing in a read mode conduction of the transmission gate, said level shifter having a control input terminal for receiving a control signal; and
a feedback latch logic circuit having a first input terminal connected to the output terminal of the sense circuit and having a second input terminal connected to the programming voltage input terminal, said feedback latch logic circuit having an output terminal that is coupled to the control input terminal of the level shifter, said output signal of the latch logic circuit having a first output state for controlling the level shifter to be in the write mode for conduction of the PMOS pass transistor to program the antifuse device, said feedback latch logic circuit having a second output state for controlling the level shifter to be in the read mode for conduction of the transmission gate.

2. The antifuse cell of claim 1 wherein the feedback latch logic circuit includes:
an asynchronous d flip-flop circuit wherein the first input terminal is for a d input signal and the second input terminal is for an enable signal;
a NAND gate having one input terminal connected to a d output terminal of the asynchronous flip-flop circuit and said NAND gate having a second input terminal connected to the programming input terminal; and
said NAND gate having an output terminal coupled to a control input terminal of the level shifter.

3. The antifuse cell of claim 1 wherein the level shifter is a d flip-flop circuit.

4. The antifuse cell of claim 1, further comprising:
a PMOS nwell level control transistor having a channel connected between a VDD voltage terminal and a nwell voltage bus;
said PMOS nwell level control transistor having a gate terminal connected to the program pin, such that:
when no programming voltage is present at the programming voltage input terminal, the PMOS nwell level control transistor conducts to provide the VDD voltage to the nwell voltage bus; and
when the programming voltage is present at the programming voltage input terminal, the PMOS nwell level control transistor does not conduct.

5. The antifuse cell of claim 4 wherein the nwell voltage bus is connected to a voltage supply terminal of the level shifter.

6. The antifuse cell of claim 1, further comprising:
a PMOS nwell boost transistor having a channel connected between the programming voltage input terminal and the nwell voltage bus;
the PMOS nwell boost transistor having a gate terminal connected to a Vdd voltage bus, such that:
when the programming voltage is present at the programming voltage input terminal, the PMOS nwell boost transistor conducts to connect the programming voltage to the nwell voltage bus; and
when the programming voltage is not present at the programming voltage input terminal, the PMOS nwell boost transistor does not conduct.

7. The antifuse cell of claim 1, further comprising a PMOS gate discharge transistor having a channel connects between the nwell voltage bus and the output terminal of the level shifter and the gate terminal of the PMOS pass transistor.

8. The antifuse cell of claim 1, further comprising a NMOS drain transistor that has a channel connected between the program pin and a Vss ground voltage terminal and that has a gate terminal connected to a Vdd voltage terminal.

9. The antifuse cell of claim 1, wherein the input terminal of the sense circuit is connected to one end of a pull-up resistor and wherein the other end of the pull-up resistor is connected to a Vdd voltage terminal.

10. A method of protecting an antifuse cell from intrusion, comprising the steps of:
providing an antifuse device having a first terminal connected to a ground voltage and having a second sensed terminal, said antifuse device having a higher resistance unprogrammed intact state and a lower resistance programmed state;
providing a programming voltage input terminal for receiving a programming voltage;
selectively connecting a PMOS pass transistor between the programming voltage and the second sensed terminal of the antifuse device to thereby program the antifuse device with the programming voltage;
selectively connecting the second sensed terminal of the antifuse device to an input terminal of a sense circuit;
sensing the state of the antifuse with a sense circuit having an input terminal connected to an output terminal of a transmission gate and having an output terminal connected to an antifuse cell output terminal;
providing alternative control signals for placing the antifuse cell in either a programming state or a read state, by using a level shifter having an output terminal connected to the control gate terminal of the PMOS pass transistor and having one or more output terminals connected to one or more control signal input terminals of the transmission gate, said level shifter providing in a write mode for conduction of the PMOS pass transistor to program the antifuse device or for conduction of the transmission gate, or said level shifter alternatively providing in a read mode conduction of the transmission gate, said level shifter having a control input terminal for receiving a control signal; and controlling the level shifter using a feedback latch logic circuit having a first input terminal connected to the output terminal of the sense circuit and having a second input terminal connected to the programming voltage input terminal, said feedback latch logic circuit having an output terminal that is coupled to the control input terminal of the level shifter, said output signal of the latch logic circuit having a first output state for controlling the level shifter to be in the write mode for conduction of the PMOS pass transistor to program the antifuse device, said feedback latch logic circuit having a second output state for controlling the level shifter to be in the read mode for conduction of the transmission gate.

11. The method of claim 10, further comprising the steps of:

connecting a channel of a PMOS nwell level control transistor to a VDD voltage terminal and a nwell voltage bus;

controlling the PMOS nwell level control transistor using a gate terminal connected to the program pin, such that:

when no programming voltage is present at the programming voltage input terminal, the PMOS nwell level control transistor is conducting to provide the VDD voltage to the nwell voltage bus; and when the programming voltage is present at the programming voltage input terminal, the PMOS nwell level control transistor is not conducting.

12. The method of claim 11, further comprising the step of:

boosting the voltage on the nwell voltage bus with a PMOS nwell boost transistor having a channel connected between the programming voltage input terminal, such that:

when the programming voltage is present at the programming voltage input terminal, the PMOS nwell boost transistor conducts to connect the programming voltage to the nwell voltage bus; and when the programming voltage is not present at the programming voltage input terminal, the PMOS nwell boost transistor does not conduct.

13. The method of claim 11, further comprising the step of discharging the gate terminal of the PMOS pass transistor using a PMOS gate discharge transistor having a channel connects between the nwell voltage bus and the output terminal of the level shifter.

14. The method of claim 10 wherein the step of sensing the state of the antifuse with a sense circuit and includes connecting one end of a pull-up resistor to a VDD voltage terminal and the other end of the pull-up resistor to the input terminal of the sense circuit.

* * * * *